United States Patent
Nakamura et al.

(10) Patent No.: US 10,685,841 B2
(45) Date of Patent: Jun. 16, 2020

(54) SEMICONDUCTOR DEVICE

(71) Applicants: HOSEI UNIVERSITY, Tokyo (JP); SCIOCS COMPANY LIMITED, Hitachi-shi, Ibaraki (JP); SUMITOMO CHEMICAL COMPANY, LIMITED, Tokyo (JP)

(72) Inventors: Tohru Nakamura, Koganei (JP); Tomoyoshi Mishima, Koganei (JP); Hiroshi Ohta, Koganei (JP); Yasuhiro Yamamoto, Koganei (JP); Fumimasa Horikiri, Hitachi (JP)

(73) Assignees: HOSEI UNIVERSITY, Tokyo (JP); SCIOCS COMPANY LIMITED, Hitachi-Shi (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/754,951

(22) PCT Filed: Aug. 23, 2016

(86) PCT No.: PCT/JP2016/074539
§ 371 (c)(1),
(2) Date: Feb. 23, 2018

(87) PCT Pub. No.: WO2017/033938
PCT Pub. Date: Mar. 2, 2017

(65) Prior Publication Data
US 2019/0181010 A1  Jun. 13, 2019

(30) Foreign Application Priority Data
Aug. 26, 2015  (JP) .................... 2015-167195

(51) Int. Cl.
*H01L 21/283* (2006.01)
*H01L 29/41* (2006.01)
(Continued)

(52) U.S. Cl.
CPC ........ *H01L 21/283* (2013.01); *H01L 29/0646* (2013.01); *H01L 29/0649* (2013.01);
(Continued)

(58) Field of Classification Search
CPC ..... H01L 21/283; H01L 29/41; H01L 29/868; H01L 29/0646; H01L 29/0649
See application file for complete search history.

(56) References Cited

U.S. PATENT DOCUMENTS

2012/0313108 A1* 12/2012 Tsuchiya ............... H01L 29/407
                                                           257/76
2013/0328120 A1* 12/2013 Ueno .................. H01L 29/7827
                                                          257/329

FOREIGN PATENT DOCUMENTS

JP   2014-13886 A   1/2014
JP   2014-236094 A  12/2014
(Continued)

OTHER PUBLICATIONS

Hatakeyama et al., "Over 3.0 GW/cm$^2$ Figure-of-Merit GaN p-n Junction Diodes on Free-Standing GaN Substrates", IEEE Electron Devices Letters, Dec. 2011, vol. 32, No. 12, pp. 1674-1676.
(Continued)

*Primary Examiner* — Marcos D. Pizarro
*Assistant Examiner* — Sue Tang
(74) *Attorney, Agent, or Firm* — Birch, Stewart, Kolasch & Birch, LLP

(57) ABSTRACT

A semiconductor device includes a semiconductor member having a mesa structure in which a first semiconductor layer
(Continued)

and a second semiconductor layer are laminated on each other and having a pn junction; an insulating film disposed on a side surface of the mesa structure and on an outside upper surface of the mesa structure; a first electrode connected to the second semiconductor layer on the upper surface of the mesa structure, and extends on the side surface of the mesa structure and on the outside upper surface of the mesa structure on the insulating film; and a second electrode connected to the first semiconductor layer on a lower surface of the first semiconductor layer, and having a capacitance of the insulating film when a reverse bias voltage is applied between the first electrode and the second electrode, so that a first voltage applied to the insulating film between a corner position (a first position) where the side surface of the insulating film disposed on the side surface of the mesa structure and the upper surface of the insulating film disposed on the outside upper surface of the mesa structure are connected to each other, and a corner position (a second position) where the side surface of the mesa structure and the outside upper surface of the mesa structure are connected to each other, is equal to or smaller than a second voltage applied to the first semiconductor layer between a pn junction interface (a third position) in a lower part of a region where the first electrode is in contact with the second semiconductor layer, and a position directly under the third position (a fourth position) at a height of the second position.

4 Claims, 6 Drawing Sheets

(51) Int. Cl.
*H01L 29/868* (2006.01)
*H01L 29/66* (2006.01)
*H01L 29/861* (2006.01)
*H01L 29/40* (2006.01)
*H01L 29/06* (2006.01)
*H01L 29/45* (2006.01)
*H01L 29/20* (2006.01)

(52) U.S. Cl.
CPC ............ *H01L 29/402* (2013.01); *H01L 29/41* (2013.01); *H01L 29/66204* (2013.01); *H01L 29/868* (2013.01); *H01L 29/8613* (2013.01); *H01L 29/2003* (2013.01); *H01L 29/452* (2013.01)

(56) References Cited

FOREIGN PATENT DOCUMENTS

| JP | 2015-23073 A | | 2/2015 | |
|----|--------------|---|--------|---|
| JP | 2015023073 A | * | 2/2015 | ......... H01L 29/8613 |

OTHER PUBLICATIONS

International Search Report (PCT/ISA/210) issued in PCT/JP2016/074539, dated Nov. 15, 2016.

International Preliminary Report on Patentability and an English translation of the Written Opinion of the International Searching Authority (Forms PCT/IB/338, PCT/IB/373 and PCT/ISA/237), dated Mar. 8, 2018, for International Application No. PCT/JP2016/074539.

* cited by examiner

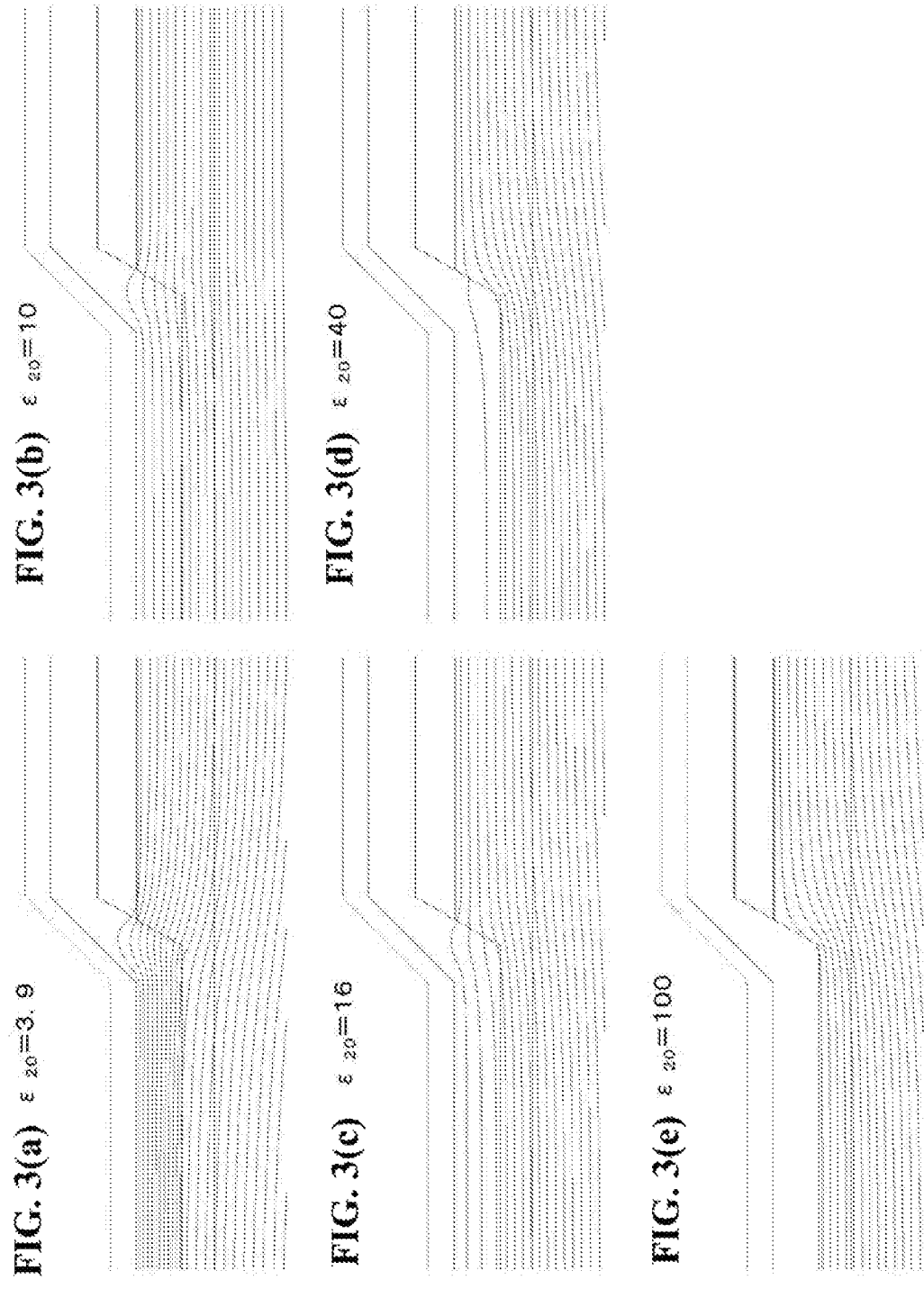

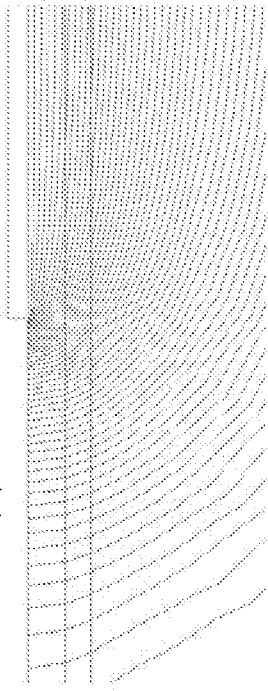
FIG. 4(a) $\varepsilon_{20}=3.9$
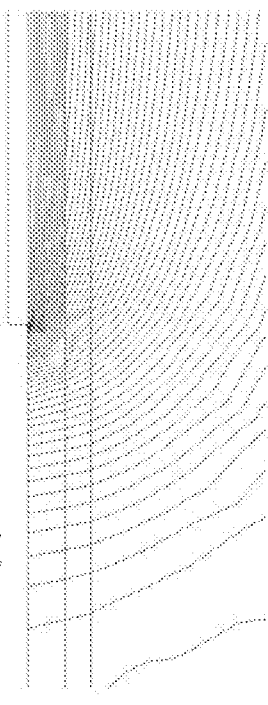
FIG. 4(b) $\varepsilon_{20}=10$
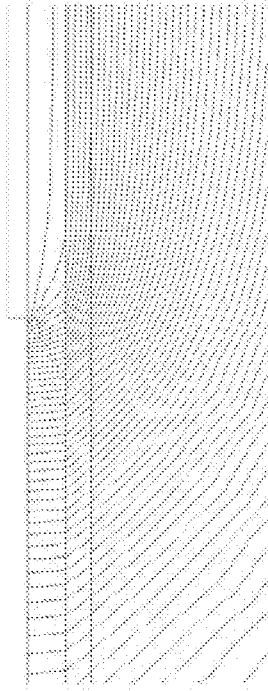
FIG. 4(c) $\varepsilon_{20}=16$
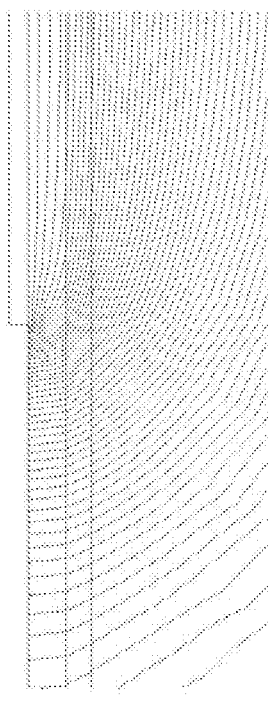
FIG. 4(d) $\varepsilon_{20}=40$
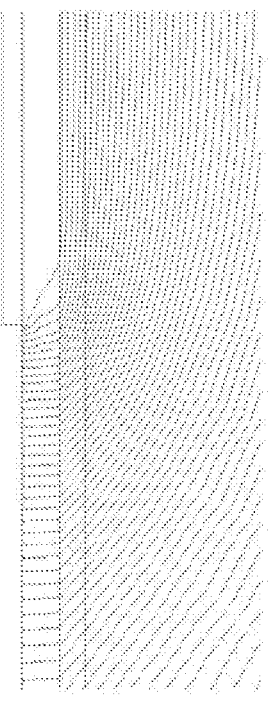
FIG. 4(e) $\varepsilon_{20}=100$

SEMICONDUCTOR DEVICE

TECHNICAL FIELD

The present invention relates to a semiconductor device.

DESCRIPTION OF RELATED ART

Attention has been payed to Wide band gap nitride-based compound semiconductors such as gallium nitride (GaN), aluminum gallium nitride (AlGaN), and gallium indium nitride (GaInN), as a high-frequency electronic element material having high breakdown voltage and high output and a light emitting element material capable of emitting light from red to ultraviolet (For example, see Non-Patent Document 1).

It is desired to provide an element structure suitable for drawing a high breakdown voltage property of a diode in which the wide band gap nitride-based compound semiconductor is used.

PRIOR ART DOCUMENT

Non-Patent Document

[Non-patent Document 1] Yoshitomo Hatakeyama, Kazuki Nomoto, Naoki Kaneda, Toshihiro Kawano, Tomoyoshi Mishima, Senior Member, IEEE, and Tohru Nakamura, "Over 3.0 GW/cm 2 Figure-of-Merit GaN pn Junction Diodes on Free-Standing GaN Substrates", IEEE Electron Devices Letters, Vol. 32, No. 12, pp. 1674-1676, 2010.

SUMMARY OF THE INVENTION

Problem to be Solved by the Invention

An object of the present invention is to provide a semiconductor device having a novel structure of improved breakdown voltage property.

Means for Solving the Problem

According to an aspect of the present invention, there is provided a semiconductor device, including:

a semiconductor member having a mesa structure in which a second semiconductor layer having one of a p-type conductivity type and an n-type conductivity type is laminated on a first semiconductor layer having the other one of the p-type conductivity type and the n-type conductivity type, so that the second semiconductor layer is exposed on an upper surface of the mesa structure, a pn junction interface is exposed on a side surface of the mesa structure, and the first semiconductor layer is exposed on an outside upper surface of the mesa structure;

an insulating film disposed on a side surface of the mesa structure and on an outside upper surface of the mesa structure;

a first electrode electrically connected to the second semiconductor layer on the upper surface of the mesa structure, and extends on the side surface of the mesa structure and on the outside upper surface of the mesa structure on the insulating film; and a second electrode electrically connected to the first semiconductor layer on a lower surface of the first semiconductor layer, and having a capacitance of the insulating film when a reverse bias voltage is applied between the first electrode and the second electrode, so that a first voltage applied to the insulating film between a first position which is a corner position where the side surface of the insulating film disposed on the side surface of the mesa structure and the upper surface of the insulating film disposed on the outside upper surface of the mesa structure are connected to each other, and a second position which is a corner position where the side surface of the mesa structure and the outside upper surface of the mesa structure are connected to each other, is equal to or smaller than a second voltage applied to the first semiconductor layer between a third position which is a position of a pn junction interface in a lower part of a region where the first electrode is in contact with the second semiconductor layer, and a fourth position which is a position directly under the third position at a height of the second position.

Advantage of the Invention

By having the capacitance of the insulating film so that the first voltage is equal to or smaller than the second voltage, it is possible to suppress occurrence of a dielectric breakdown at a position of the pn junction interface on the side surface of the mesa structure, earlier than the position of the pn junction interface in the lower part of the region where the first electrode is in contact with the second semiconductor layer.

BRIEF DESCRIPTION OF THE DRAWINGS

FIGS. 3(a) to 3(e) are schematic cross-sectional views showing equipotential line distributions in the vicinity of mesa side surfaces in the simulation.

FIGS. 4(a) to 4(e) are schematic sectional views showing equipotential line distributions in the vicinity of the electrode ends of p-side electrodes in the simulation.

DETAILED DESCRIPTION OF THE INVENTION

Figure 1:
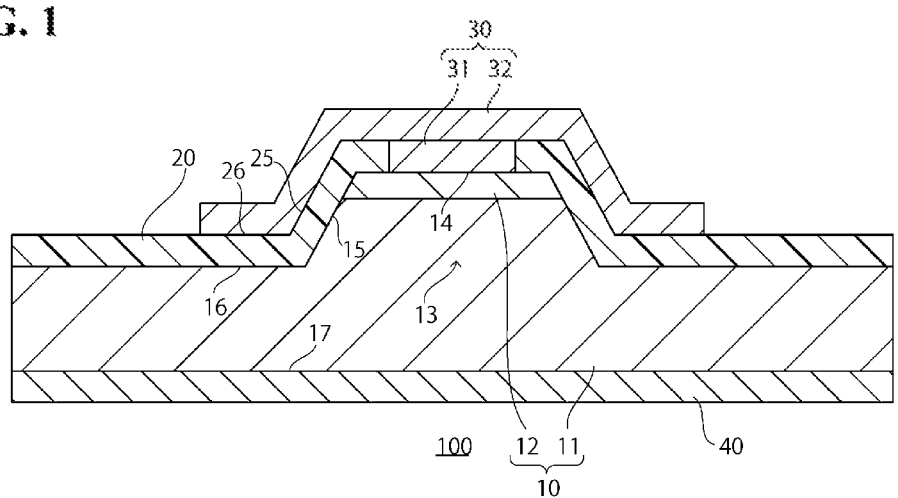
FIG. 1 is a schematic cross-sectional view of a semiconductor device according to an embodiment of the present invention.

A semiconductor device 100 according to an embodiment of the present invention will be described. FIG. 1 is a schematic cross-sectional view of a semiconductor device 100 according to an embodiment of the present invention.

The semiconductor device 100 includes a semiconductor member 10 having a pn junction, an insulating film 20, a p-side electrode 30, and an n-side electrode 40.

The semiconductor member 10 has a mesa structure 13 in which a p-type semiconductor layer 12 is laminated on an n-type semiconductor layer 11. The p-type semiconductor layer 12 is exposed on the upper surface (mesa upper surface) 14 of the mesa structure 13, and a junction interface, that is, a pn junction interface between the p-type semiconductor layer 12 and the n-type semiconductor layer 11 is exposed on the side surface (mesa side surface) 15 of the mesa structure 13, and the n-type semiconductor layer 11 is exposed on the outside upper surface (mesa outside upper surface) 16 of the mesa structure 13. Here, "outside" means outside in a plan view. Further, "exposure" means appearing on the surface of the semiconductor member 10, which does not mean appearing on the surface of the semiconductor device 100.

The insulating film 20 is disposed on the mesa side surface 15 and on the mesa outside upper surface 16. The insulating film 20 may extend on the mesa upper surface 14. The insulating film 20 is a conformal film having a shape conforming to a convex shape of the mesa structure 13. The insulating film 20 has an opening for securing contact between the p-type semiconductor layer 12 and the p-side electrode 30 on the mesa upper surface 14.

The p-side electrode 30 is in contact with and electrically connected to the p-type semiconductor layer 12 on the mesa upper surface 14, and extends on the mesa side surface 15 and on the mesa outside upper surface 16 on the insulating film 20. Namely, the insulating film 20 is interposed between the semiconductor member 10 and the p-side electrode 30 on the mesa side surface 15 and on the mesa outside upper surface 16.

In the structure shown in the figure, the p-side electrode 30 has a laminated structure of a p-side electrode lower layer 31 and a p-side electrode upper layer 32. The p-side electrode lower layer 31 is disposed within a thickness of the insulating film 20 so as to make contact with the p-type semiconductor layer 12, and the p-side electrode upper layer 32 is disposed above the insulating film 20. The p-side electrode 30 may have a structure in which the p-side electrode lower layer 31 and the p-side electrode upper layer 32 are integrally formed.

The insulating film 20 covers an entire surface of the mesa outside upper surface 16, and the p-side electrode 30 covers a part of the mesa outside upper surface 16. Namely, the outside of the electrode end of the p-side electrode 30 is covered with the insulating film 20. The insulating film 20 functions as an insulating film interposed between the semiconductor member 10 and the p-side electrode 30 and also functions as a surface protective film of the semiconductor member 10.

The n-side electrode 40 is in contact with and electrically connected to the n-type semiconductor layer 11 on the lower surface 17 of the n-type semiconductor layer 11. The n-side electrode 40 extends to the outside of the p-side electrode 30, and is formed, for example, on an entire surface of the lower surface 17 of the n-type semiconductor layer 11.

When a voltage is applied between the p-side electrode 30 and the n-side electrode 40, the voltage is applied to the pn junction formed by the p-type semiconductor layer 12 and the n-type semiconductor layer 11, and the semiconductor device 100 can be operated as a semiconductor element.

The semiconductor member 10, namely, the n-type semiconductor layer 11 and the p-type semiconductor layer 12 are made of a nitride-based compound semiconductor, for example, gallium nitride (GaN). Explanation will be continued hereafter, with a case that the semiconductor member 10 is made of GaN as an example. A relative dielectric constant of GaN is 9.5.

A material used for forming the insulating film 20 will be described later.

The p-side electrode 30 is made of a metal such as palladium (Pd), titanium (Ti), aluminum (Al) or the like, for example. The n-side electrode 40 is made of a metal such as titanium (Ti), aluminum (Al) or the like, for example.

Inventors of the present invention propose a technique as described hereafter, as a technique of improving a breakdown voltage property of the semiconductor device 100, more specifically, as a technique of improving the breakdown voltage property when a reverse bias voltage is applied between the p-side electrode 30 and the n-side electrode 40.

Figure 2A:
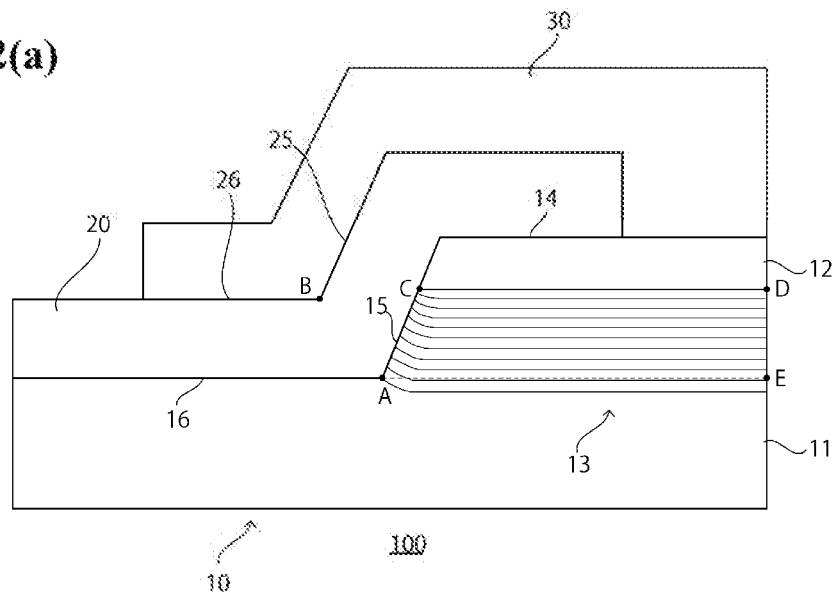
FIG. 2(a) is a schematic cross-sectional view showing an upper portion of the semiconductor device according to the embodiment.

FIG. 2(*a*) is a schematic cross-sectional view showing a left side upper portion (the vicinity of the mesa structure 13, the insulating film 20, and the p-side electrode 30) of the semiconductor device 100 shown in FIG. 1, and conceptually shows the equipotential line distribution in the mesa portion when a predetermined reverse bias voltage is applied between the p-side electrode 30 and the n-side electrode 40.

In FIG. 2(*a*), point A indicates a corner position where the mesa side surface 15 and the mesa outside upper surface 16 are connected to each other. Point B indicates a corner position where the side surface 25 of the insulating film 20 disposed on the mesa side surface 15 and the upper surface 26 of the insulating film 20 disposed on the mesa outside upper surface 16 are connected to each other. Point C indicates a position of a pn junction interface on the mesa side surface 15. Point D indicates a position of the pn junction interface in a lower part of a region where the p-side electrode 30 is in contact with the p-type semiconductor layer 12. Point E indicates a position directly under point D at the same height as point A. For clarity of the illustration, black circles are attached to points A to E, respectively.

An electric field intensity inside of the mesa structure 13 is maximum at the pn junction interface, namely, at point D. Accordingly, a case that dielectric breakdown occurs at point D when a large reverse bias voltage is applied, can be said to be a case that the breakdown voltage property of the semiconductor device 100 is maximized. However, the electric field intensity at a circumference of the mesa structure 13, namely, the electric field intensity at point C or A on the side surface 15, as described below, varies depending on a formation mode of the insulating film 20 and exceeds the electric field intensity at point D in some cases. In this case, dielectric breakdown occurs at point C or point A first, not at point D. Therefore, by suppressing the electric field intensity at points C or A, the breakdown voltage property can be improved.

First, a technique of suppressing the electric field intensity at point C will be considered. When the voltage $V_{CA}$ applied between CA on the mesa side surface 15 is increased, electric field concentration occurs at point C. When the voltage $V_{CA}$ is larger than the voltage $V_{DE}$ which is applied between DE in the mesa structure 13 ($V_{CA} > V_{DE}$), dielectric breakdown occurs at point C earlier than point D, due to electric field concentration at point C. Therefore, by setting $V_{CA} \leq V_{DE}$, occurrence of the dielectric breakdown at point C earlier than point D can be suppressed.

Meanwhile, the voltage $V_{BA}$ applied to the insulating film 20 between BA is equal to the voltage $V_{CA}$ ($V_{BA} = V_{CA}$). Accordingly, $V_{CA} \leq V_{DE}$ can be realized by decreasing the voltage $V_{BA}$. Here, the p-side electrode 30 and the p-type semiconductor layer 12 are in ohmic contact with each other, and the p-side electrode 30 and the p-type semiconductor layer 12, namely, point B and point C can be handled as the same potential.

The capacitance $C_{20}$ per unit area of the insulating film 20 can be expressed by the following equation (1).

$$C_{20} = \varepsilon_0 \varepsilon_{20} / T_{BA} \tag{1}$$

Wherein, $\varepsilon_0$ is a dielectric constant in vacuum state, $\varepsilon_{20}$ is a relative dielectric constant of a material used for forming the insulating film 20, and $T_{BA}$ is a thickness of the insulating film 20 between BA.

The voltage $V_{BA}$ is inversely proportional to the capacitance $C_{20}$ of the insulating film 20 and can be expressed by the following equation (2).

$$V_{BA} \propto 1/C_{20} = T_{BA}/\varepsilon_0 \varepsilon_{20} \qquad (2)$$

Accordingly, the capacitance $C_{20}$ of the insulating film 20 is increased by decreasing the film thickness $T_{BA}$ between the BA of the insulating film 20 or by increasing the relative dielectric constant ε20 of the insulating film 20, and thereby the voltage $V_{BA}$ applied to the insulating film 20 can be decreased. Then, the voltage $V_{CA}$ applied between the CA on the mesa side surface 15 can be decreased by decreasing the voltage $V_{BA}$ applied to the insulating film 20.

In this manner, by selecting the capacitance $C_{20}$ of the insulating film 20 so that the voltage $V_{BA}$ applied to the insulating film 20 between BA becomes equal to or smaller than the voltage $V_{DE}$ applied to the n type semiconductor layer 11 between DE ($V_{BA} \leq V_{DE}$), it is possible to set the voltage $V_{CA}$ applied between CA on the mesa side surface 15 to be equal to or smaller than the voltage $V_{DE}$ ($V_{CA} \leq V_{DE}$), and it is possible to suppress occurrence of the dielectric breakdown at point C earlier than point D.

Figure 2B:
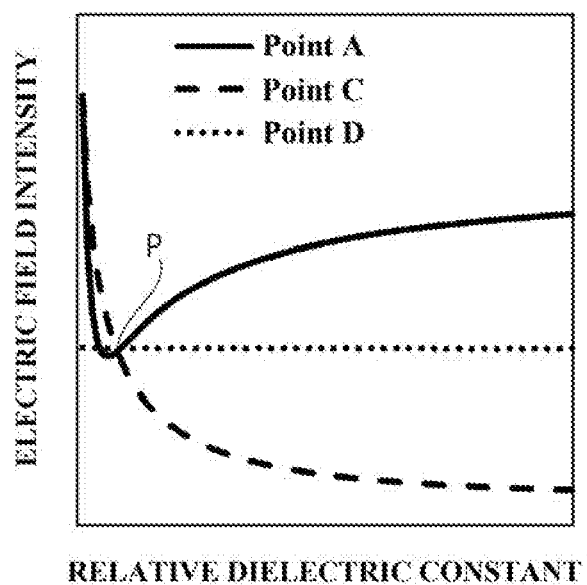
FIG. 2(b) is a graph showing an electric field intensity at points A, C and D obtained by simulation.

FIG. 2(b) is a graph showing the electric field intensity at points A, C and D obtained by simulation, and indicates that the electric field intensity at each point, depends on the relative dielectric constant ε20 of the insulating film 20.

In this simulation, the material of the semiconductor member 10 was selected as GaN. Namely, the relative dielectric constant $\varepsilon_{10}$ of the semiconductor member 10 was set to 9.5. Then, the material of the insulating film 20, namely, the relative dielectric constant ε20 of the insulating film 20 was varied.

The structure of the n-type semiconductor layer 11 used in the simulation was a three layer structure of an n-type GaN layer having a Si concentration of $2 \times 10^{18}$ cm$^{-3}$ and a thickness of 2 μm, an n-type GaN layer having a Si concentration of $1.1 \times 10^{16}$ cm$^{-3}$ and a thickness of 17 μm, and an n-type GaN layer having a Si concentration of $3 \times 10^{15}$ cm$^{-3}$ and a thickness of 1 μm, in an order from a bottom. On the outside of the mesa, the uppermost n-type GaN layer was etched by about 0.5 μm by mesa etching. Namely, a height (thickness between DE) by which the n-type semiconductor layer 11 of the mesa structure 13 protrudes from the mesa outside upper surface 16, was set to about 0.5 μm. The thickness of the insulating film 20 on the mesa outside upper surface 16 was made thinner than that between DE and was set to about 0.4 μm. The reverse bias voltage applied between the p-side electrode 30 and the n-side electrode 40 was set to 1000 V.

In this simulation, the structure of the semiconductor device 100, namely, the thickness of the insulating film 20 was set to be constant. Accordingly, increase of the relative dielectric constant ε20 of the insulating film 20 corresponds to increase of the capacitance $C_{20}$ of the insulating film 20, and corresponds to decrease of the voltage $V_{BA}$ applied to the insulating film 20. Then, decrease of the voltage $V_{BA}$ corresponds to decrease of the voltage $V_{CA}$ applied between CA on the mesa side surface 15, and corresponds to decrease of the electric field intensity at point C.

Namely, as shown in FIG. 2(b), the electric field intensity at point C is decreased as the relative dielectric constant ε20 is increased. On the other hand, the electric field intensity at point D is constant irrespective of the relative dielectric constant $\varepsilon_{20}$. In FIG. 2(b), a position where the electric field intensity at point C is equal to the electric field intensity at point D, namely, a position where a curve showing the electric field intensity at point C and a curve showing the electric field intensity at point D intersect with each other, is indicated by P. A value of the relative dielectric constant $\varepsilon_{20}$ at position P is referred to as $\varepsilon_P$.

By setting the relative dielectric constant $\varepsilon_{20}$ to equal to or larger than $\varepsilon_P$, the electric field intensity at point C can be made equal to or smaller than the electric field intensity at point D, and it is possible to suppress the occurrence of the dielectric breakdown at point C earlier than point D. This condition corresponds to $V_{CA} \leq V_{DE}$, namely, $V_{BA} \leq V_{DE}$.

In this simulation, $\varepsilon_P$ was 9, which was approximately equal to 9.5 which was the relative dielectric constant $\varepsilon_{10}$ of the semiconductor member 10 (GaN) (slightly smaller than this value). Therefore, the relative dielectric constant $\varepsilon_{20}$ of the insulating film 20 is preferably equal to or larger than the relative dielectric constant $\varepsilon_{10}$ of the semiconductor member 10, as a criterion for selecting the material for suppressing the occurrence of the dielectric breakdown at point C earlier than point D.

As the material of the insulating film 20 having the relative dielectric constant of 9.5 or more of the specific semiconductor member 10 shown in the example, for example, metal oxides such as cerium oxide ($CeO_2$, relative dielectric constant 26), hafnium oxide ($HfO_2$, relative dielectric constant 25), titanium oxide ($TiO_2$, relative dielectric constant: 80 to 180), tantalum oxide ($Ta_2O_5$, relative dielectric constant 25), strontium titanate ($SrTiO_3$, relative dielectric constant 200), barium titanate ($BaTiO_3$, relative dielectric constant 600), barium strontium titanate (BaSrTiO$_3$, and relative dielectric constant 300 to 800 (varies depending on the ratio of Ba and Sr)), can be given.

As an ordinary material used for forming the insulating film 20, silicon oxide ($SiO_2$, relative dielectric constant 3.9) and silicon nitride ($Si_3N_4$, relative dielectric constant 7), can be given. The relative dielectric constants of these materials are smaller than the relative dielectric constant $\varepsilon_{10}$ of the semiconductor member 10 and smaller than $\varepsilon_P$.

Next, a technique of suppressing the electric field intensity at point A will be considered. According to this simulation, regarding the dependency of the electric field intensity at point A on the relative dielectric constant $\varepsilon_{20}$, the following matter is found.

The electric field intensity at point A is decreased as the relative dielectric constant $\varepsilon_{20}$ is increased from the vicinity of zero, and takes a minimum value that is smaller than the electric field intensity at point D at a relative dielectric constant $\varepsilon_{20}$ which is slightly smaller than $\varepsilon_P$, and is increased as the dielectric constant $\varepsilon_{20}$ is increased from the minimum value.

Further, a position where the electric field intensity at point A is increased from the minimum value and becomes equal to the electric field intensity at point D, namely, a position where the curve showing the electric field intensity at point A and the curve showing the electric field intensity at point D intersect with each other, coincides with the position P where the electric field intensity at point C is equal to the electric field intensity at point D. Namely, the electric field intensity at point A is equal to the electric field intensity at point C, and is equal to the electric field intensity at point D in a case of the relative dielectric constant $\varepsilon_{20} = \varepsilon_P$.

Accordingly, by setting the relative dielectric constant $\varepsilon_{20}$ to $\varepsilon_P$, both the electric field intensity at point C and the electric field intensity at point A can be equal to the electric field intensity at point D (equal to or smaller than the electric field intensity at point D), and both of the occurrence of the dielectric breakdown at point C earlier than point D and the occurrence of the dielectric breakdown at point A earlier than point D can be suppressed. This condition corresponds to $V_{CA}=V_{DE}$, that is, $V_{BA}=V_{DE}$.

Namely, $V_{CA}$ can be made equal to $V_{DE}$ ($V_{CA}=V_{DE}$) by selecting the capacitance $C_{20}$ of the insulating film 20 so that $V_{BA}$ is equal to $V_{DE}$ ($V_{BA}=V_{DE}$), thus making it possible to suppress the occurrence of the dielectric breakdown at point C earlier than point D, and suppress the occurrence of the dielectric breakdown at point A earlier than point D.

In a range where the relative dielectric constant $\varepsilon_{20}$ exceeds $\varepsilon_P$, the electric field intensity at point A exceeds the electric field intensity at point D and the electric field intensity at point C, and the electric field intensity at point A is largest. An element having the relative dielectric constant $\varepsilon_{20}$ set to $\varepsilon_P$ or more (or the relative dielectric constant $\varepsilon_{10}$ or more of the semiconductor member 10), is referred to as an element having a high dielectric constant according to an embodiment.

Here, as a comparative embodiment of the structure of this simulation, an element with the insulating film 20 made of silicon oxide or silicon nitride which is an ordinary material, will be considered. Such an element is referred to as an element having a low relative dielectric constant according to the comparative embodiment. The relative dielectric constant of silicon oxide or silicon nitride is smaller than $\varepsilon_P$. Therefore, in the element having the low relative dielectric constant according to the comparative embodiment, the electric field intensity at point C is largest.

Therefore, by selecting the relative dielectric constant $\varepsilon_{20}$ so that the electric field intensity at point A of the high relative dielectric constant element of this embodiment is less than the electric field intensity at point C of the element having the low relative dielectric constant according to the comparative embodiment, the dielectric breakdown can be suppressed as compared with the element having the low relative dielectric constant according to the comparative embodiment, namely, the element with the insulating film 20 made of silicon oxide or silicon nitride which is an ordinary material.

An example of such a relative dielectric constant $\varepsilon_{20}$ will be described based on this simulation. In this simulation, the electric field intensity at point C of the element having the low relative dielectric constant according to the comparative embodiment is 2 MV/cm when silicon oxide (relative dielectric constant 3.9) is used, and is 1.25 MV/cm when silicon nitride (relative dielectric constant 7) is used. In the element having a high relative dielectric constant according to this embodiment, the relative dielectric constant $\varepsilon_{20}$ is 60 when the electric field intensity at point A is equal to 2 MV/cm, and the relative dielectric constant $\varepsilon_{20}$ is 12 when the electric field intensity at point A is equal to 1.25 MV/cm. The electric field intensity at point D is 1.2 MV/cm.

Accordingly, in this simulation, by setting the relative dielectric constant $\varepsilon_{20}$ of the insulating film 20 to less than 60 in the element having a high relative dielectric constant according to the embodiment, the dielectric breakdown is less likely to occur as compared with the element having a low relative dielectric constant according to the comparative embodiment, when silicon oxide is used for the insulating film 20, and by setting the relative dielectric constant $\varepsilon_{20}$ of the insulating film 20 to less than 12, the dielectric breakdown can be suppressed as compared with the element having the low relative dielectric constant according to the comparative embodiment when silicon nitride is used for the insulating film 20.

As described above, by selecting the capacitance $C_{20}$ of the insulating film 20 so as to satisfy $V_{BA} \leq V_{DE}$, $V_{CA} \leq V_{DE}$ can be established, and the dielectric breakdown at point C earlier than point D is less likely to occur.

As a criterion for selecting the material of the insulating film 20 for suppressing the occurrence of dielectric breakdown at point C earlier than point D, it is preferable that the relative dielectric constant $\varepsilon_{20}$ of the insulating film 20 is equal to or larger than the relative dielectric constant $\varepsilon_{10}$ of the semiconductor member 10.

By selecting the capacitance $C_{20}$ of the insulating film 20 so as to satisfy $V_{BA}=V_{DE}$, $V_{CA}=V_{DE}$ can be established and the dielectric breakdown at point C earlier than point D is less likely to occur, and the dielectric breakdown at point A earlier than point D is less likely to occur.

For the element in which the relative dielectric constant $\varepsilon_{20}$ is set to equal to or larger than $\varepsilon_P$ (or set to equal to or larger than the relative dielectric constant $\varepsilon_{10}$ of the semiconductor member 10), the dielectric breakdown is less likely to occur by selecting the relative dielectric constant $\varepsilon_{20}$ of the insulating film 20 so that the electric field intensity at point A is less than the electric field intensity at point C of the element having the insulating film 20 made of silicon oxide or silicon nitride which is an ordinary material used for the insulating film.

When a voltage $V_0$ is applied between the pn electrodes 30 and 40, a thickness $T_0$ of a depletion layer under the p-side electrode 30 is expressed as:

$$T_0 = \sqrt{\frac{2\varepsilon_0 \varepsilon_{10} N_a (V_D - V_0)}{q N_d (N_d + N_a)}}$$

Wherein $\varepsilon_0$ is the dielectric constant in vacuum state $(8.85\times10^{-12}$ (F/m)), $\varepsilon_{10}$ is the relative dielectric constant (for example 9.5) of the semiconductor member 10, $N_a$ and $N_d$ are acceptor concentration, donor concentration, $V_D$ is a diffusion potential, and q is an electric charge $(1.6\times10^{-19}$ (C)).

The voltage $V_{DE}$ applied between DE is expressed by $$V_{DE} = -\frac{q N_d}{\varepsilon_0 \varepsilon_{10}} \left( \frac{1}{2} T_{DE}^2 - T_0 T_{DE} \right)$$

wherein $T_{DE}$ is a thickness between DE and can be derived from a film thickness of the p-type semiconductor layer 12 and a mesa step.

Further, when the voltage $V_0$ is applied between pn electrodes 30 and 40, the voltage $V_{BA}$ applied to the insulating film 20 (between BA) and the voltage $V_{DL}$ applied to the depletion layer directly under the insulating film 20, is calculated using $$C_{20} = \frac{\varepsilon_0 \varepsilon_{20}}{T_{BA}}$$

$$C_{DL} = \frac{\varepsilon_0 \varepsilon_{10}}{T_{DL}} = \sqrt{\frac{q \varepsilon_0 \varepsilon_{10} N_d}{2 V_{DL}}}$$

$$\frac{V_0}{Q} = \frac{1}{C_{20}} + \frac{1}{C_{DL}}$$

which indicates the capacitance $C_{20}$ of the insulating film 20 per unit area, and the capacitance $C_{DL}$ of the depletion layer directly under the insulating film 20.

Wherein $\varepsilon_{20}$ is the relative dielectric constant of the insulating film 20, $V_{DL}$ is the voltage (=$V_0$–$V_{BA}$) applied to the depletion layer directly under the insulating film 20, $T_{BA}$ is a film thickness (between BA) of the insulating film 20, $T_{DL}$ is a film thickness of the depletion layer directly under the insulating film 20, and Q is a charge (=a charge stored in the depletion layer) stored in the insulating film 20.

$V_{BA}$, $V_{DL}$, $C_{20}$ (capacitance of the insulating film 20 per unit area) can be derived if the film thickness $T_{BA}$ and the relative dielectric constant $\varepsilon_{20}$ of the insulating film 20 are determined, and their relationship can be specified.

FIG. 3 (a) to FIG. 3 (e) are schematic cross-sectional views showing equipotential line distributions in the vicinity of the mesa side surface 15 in the abovementioned simulation, and indicates a case that the relative dielectric constant $\varepsilon_{20}$ of the insulating film 20 are 3.9, 10, 16, 40, and 100, respectively. The reverse bias voltage is 1000 V, and the equipotential lines are displayed at 20 V intervals.

It is found that the electric field intensity at point C is decreased as the relative dielectric $\varepsilon_{20}$ is increased to 3.9, 10, 16, 40, and 100. Further, from these figures, although it is difficult to understand that the electric field intensity at point A takes a minimum value between 3.9 and 10 of the relative dielectric constant $\varepsilon_{20}$, it is found that the electric field intensity at point A is increased as the relative dielectric constant $\varepsilon_{20}$ is increased to 10, 16, 40, and 100.

FIGS. 4 (a) to 4 (e) are schematic cross-sectional views showing equipotential line distributions in the vicinity of the electrode end of the p-side electrode 30 in the abovementioned simulation, and indicates a case that the relative dielectric constant $\varepsilon_{20}$ of the insulating film 20 are 3.9, 10, 16, 40, and 100, respectively. The reverse bias voltage is 1000 V, and the equipotential lines are displayed at 20 V intervals.

It is found that the electric field intensity in the vicinity of the electrode end is decreased as the relative dielectric constant $\varepsilon_{20}$ is increased to 3.9, 10, 16, 40, and 100. Therefore, it is found that increase of the relative dielectric constant $\varepsilon_{20}$ of the insulating film 20 also has an effect of suppressing the dielectric breakdown in the vicinity of the electrode end of the p-side electrode 30.

Figure 5A:
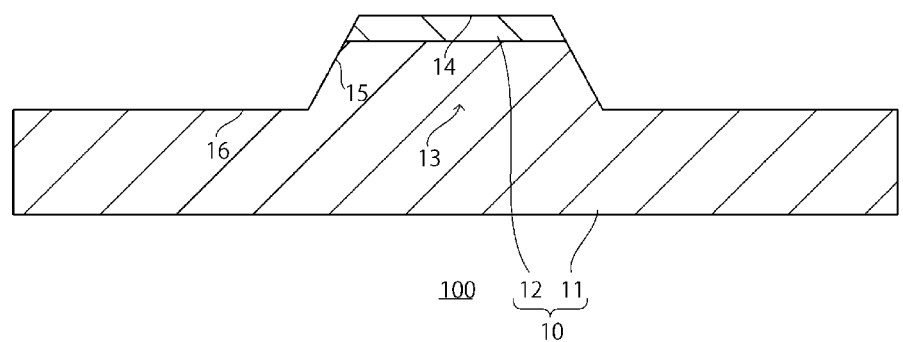
FIGS. 5(a) and 5(b) are schematic cross-sectional views showing manufacturing steps of the semiconductor device according to an embodiment.
Figure 5B:
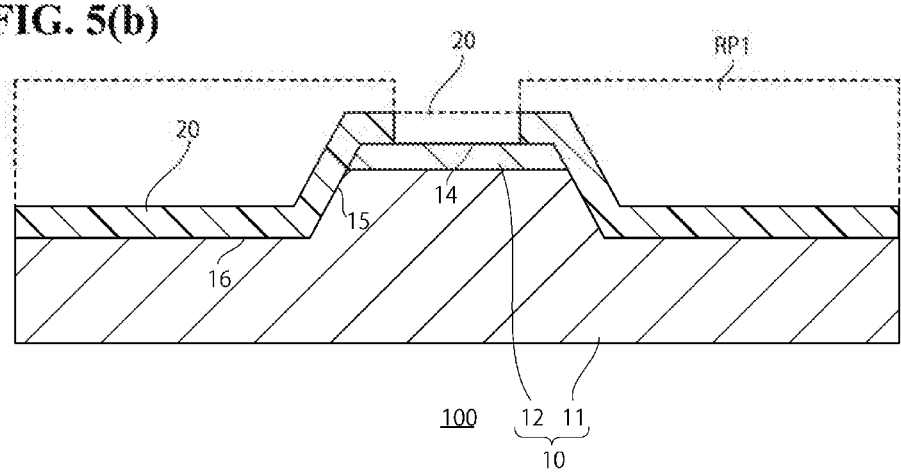

Next, an example of a manufacturing method of the semiconductor device 100 according to the embodiment will be described. FIGS. 5 (a), 5 (b), 6 (a), and 6 (b) are schematic cross-sectional views showing steps of manufacturing the semiconductor device 100 according to the embodiment.

FIG. 5 (a) will be referenced. First, a laminated member of the n-type semiconductor layer 11 and the p-type semiconductor layer 12 is prepared. For example, an n-type GaN layer having a Si concentration of $2\times10^{18}$ cm$^{-3}$ and a thickness of 2 μm and an n-type GaN layer having a Si concentration of $1\times10^{16}$ cm$^{-3}$ and a thickness of 20 μm, are grown on an n-type GaN substrate having a silicon (Si) concentration of $1.5\times10^{18}$ cm$^{-3}$ and a thickness of 400 μm, and a p-type GaN layer having a magnesium (Mg) concentration of $5\times10^{17}$ cm$^{-3}$ and a thickness of 500 nm, and a p-type GaN layer having a Mg concentration of $2\times10^{20}$ cm$^{-3}$ and a thickness of 30 nm are further grown thereon, to thereby prepare a laminated member. As a deposition method, for example, metal organic vapor phase epitaxy (MOVPE) can be used.

Then, the mesa structure 13 is formed by etching the laminated member from the side of the p-type semiconductor layer 12 on the outside of the mesa structure 13 in a thickness up to the middle of the n-type semiconductor layer 11. The depth for digging the n-type semiconductor layer 11 from the pn junction interface, namely, the height of a protrusion of the n-type semiconductor layer 11 of the mesa structure 13 from the mesa outside upper surface 16 is, for example, 500 nm. In this manner, the semiconductor member 10 is prepared.

FIG. 5 (b) will be referenced. The insulating film 20 is formed on the entire surface of the mesa upper surface 14, the mesa side surface 15, and the mesa outside upper surface 16 of the semiconductor member 10. The insulating film 20 is formed, for example, by depositing cerium oxide in a thickness of 400 nm by sputtering.

Next, a resist pattern RP1 is formed, so as to have an opening in a contact area between the p-type semiconductor layer 12 and the p-side electrode 30 on the mesa upper surface 14, and the insulating film 20 in the opening is etched using the resist pattern RP1 as a mask. When the cerium oxide is used for the insulating film 20, such an etching can be performed, for example, with a chemical solution satisfying $H_2SO_4$:$H_2O_2$:$H_2O$=1:1:1.

Figure 6A:
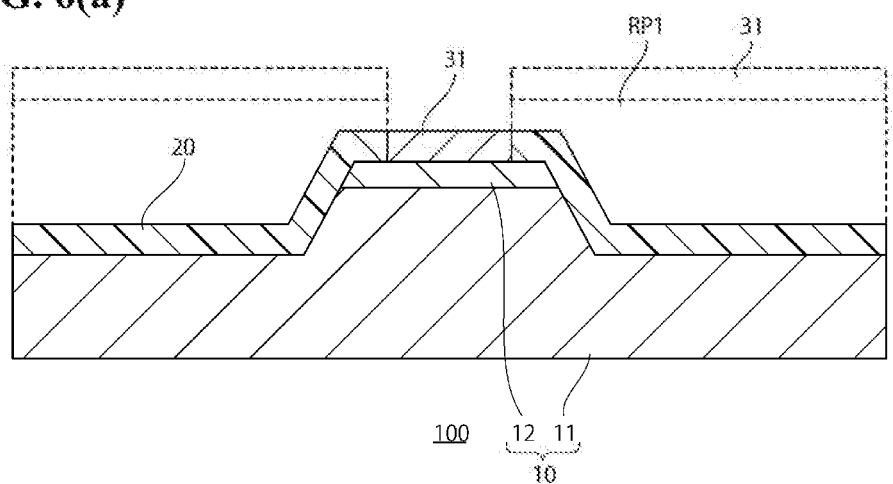
FIGS. 6(a) and 6(b) are schematic cross-sectional views showing manufacturing steps of the semiconductor device according to an embodiment.
Figure 6B:
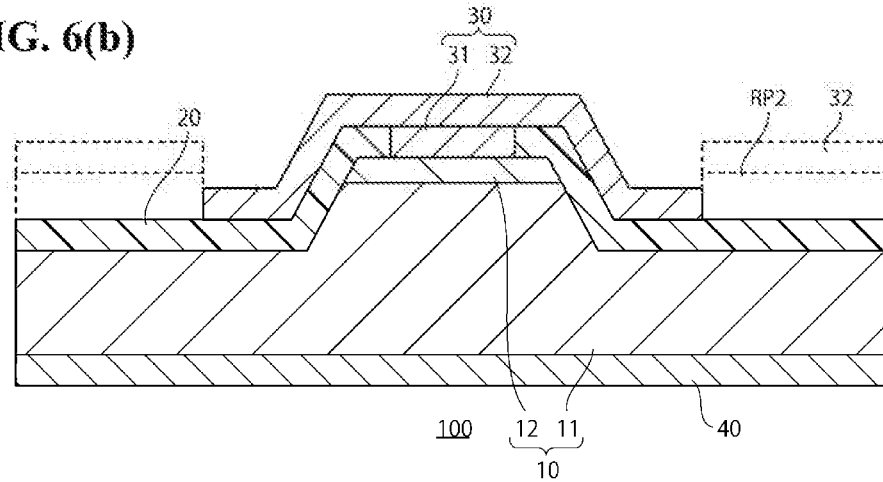

FIG. 6 (a) will be referenced. The p-side electrode lower layer 31 is formed on the entire surface, while leaving the resist pattern RP1. The p-side electrode lower layer 31 is formed, for example, by depositing palladium in a thickness of 200 nm by sputtering. Then, the p-side electrode lower layer 31 is left in the opening of the insulating film 20, by lift-off to remove an unnecessary portion of the p-side electrode lower layer 31 together with the resist pattern RP1.

FIG. 6 (b) will be referenced. A resist pattern RP2 having an opening in the shape of the p-side electrode upper layer 32 is formed, and the p-side electrode upper layer 32 is formed on the entire surface. The p-side electrode upper layer 32 is formed, for example, by depositing titanium in a thickness of 30 nm by sputtering and depositing aluminum in a thickness of 300 nm thereon by sputtering. Then, the p-side electrode upper layer 32 of a necessary portion is left by lift-off to remove the unnecessary portion of the p-side electrode upper layer 32 together with the resist pattern RP2.

Further, an n-side electrode 40 is formed on an entire lower surface of the n-type semiconductor layer 11. The n-side electrode 40 is formed, for example, by depositing titanium in a thickness of 50 nm by sputtering, and depositing aluminum thereon in a thickness of 250 nm by sputtering. In this manner, the semiconductor device 100 according to the embodiment is manufactured.

As described above, the present invention has been described based on embodiments. However, the present invention is not limited thereto. For example, it will be obvious to those skilled in the art that various modifications, improvements, combinations, etc. are possible.

For example, it is also possible to constitute the semiconductor device 100 with reversed n-type conductivity type and p-type conductivity type of the abovementioned embodiment.

Embodiments of the present invention will be supplementarily described hereafter.

(Supplementary Description 1)

There is provided a semiconductor device, including:

a semiconductor member having a mesa structure in which a second semiconductor layer having one of a p-type conductivity type and an n-type conductivity type is laminated on a first semiconductor layer having the other one of the p-type conductivity type and the n-type conductivity type, so that the second semiconductor layer is exposed on an upper surface of the mesa structure, a pn junction interface is exposed on a side surface of the mesa structure, and the first semiconductor layer is exposed on an outside upper surface of the mesa structure;

an insulating film disposed on a side surface of the mesa structure and on an outside upper surface of the mesa structure;

a first electrode electrically connected to the second semiconductor layer on the upper surface of the mesa structure, and extends on the side surface of the mesa structure and on the outside upper surface of the mesa structure on the insulating film; and a second electrode electrically connected to the first semiconductor layer on a lower surface of the first semiconductor layer, and having a capacitance of the insulating film when a reverse bias voltage is applied between the first electrode and the second electrode, so that a first voltage applied to the insulating film between a first position which is a corner position where the side surface of the insulating film disposed on the side surface of the mesa structure and the upper surface of the insulating film disposed on the outside upper surface of the mesa structure are connected to each other, and a second position which is a corner position where the side surface of the mesa structure and the outside upper surface of the mesa structure are connected to each other, is equal to or smaller than a second voltage applied to the first semiconductor layer between a third position which is a position of a pn junction interface in a lower part of a region where the first electrode is in contact with the second semiconductor layer, and a fourth position which is a position directly under the third position at a height of the second position.

(Supplementary Description 2)

The semiconductor device according to supplementary description 1, which has a capacitance of the insulating film so that the first voltage is equal to the second voltage.

(Supplementary Description 3)

The semiconductor device according to supplementary description 1 or 2, wherein a relative dielectric constant of the insulating film is equal to or larger than a relative dielectric constant of the semiconductor member (the first semiconductor layer and the second semiconductor layer).

(Supplementary Description 4)

The semiconductor device according to any one of the supplementary descriptions 1 to 3, which has a relative dielectric constant of the insulating film so that an electric field intensity applied to the second position with the reverse bias voltage applied, is less than an electric field intensity applied to the fifth position which is a position of a pn junction interface of the side surface of the mesa structure when the insulating film is assumed to be made of silicon oxide.

(Supplementary Description 5)

The semiconductor device according to any one of the supplementary descriptions 1 to 4, which has a relative dielectric constant of the insulating film so that an electric field intensity applied to the second position with the reverse bias voltage applied, is less than the electric field intensity applied to the fifth position which is the position of the pn junction interface on the side surface of the mesa structure, when the insulating film is made of silicon nitride.

(Supplementary Description 6)

A semiconductor device, including:

a semiconductor member having a mesa structure in which a second semiconductor layer having one of a p-type conductivity type and an n-type conductivity type is laminated on a first semiconductor layer having the other one of the p-type conductivity type and the n-type conductivity type, so that the second semiconductor layer is exposed on an upper surface of the mesa structure, a pn junction interface is exposed on a side surface of the mesa structure, and the first semiconductor layer is exposed on an outside upper surface of the mesa structure;

an insulating film disposed on a side surface of the mesa structure and on an outside upper surface of the mesa structure;

a first electrode electrically connected to the second semiconductor layer on the upper surface of the mesa structure, and extends on the side surface of the mesa structure and on the outside upper surface of the mesa structure on the insulating film; and a second electrode electrically connected to the first semiconductor layer on a lower surface of the first semiconductor layer, wherein a relative dielectric constant of the insulating film is equal to or larger than a relative dielectric constant of the semiconductor member.

DESCRIPTION OF SIGNS AND NUMERALS

10 Semiconductor member
11 n type semiconductor layer
12 p-type semiconductor layer
20 Insulating film
21 First insulating layer
22 second insulating layer
30 p-side electrode
40 n-side electrode
100 Semiconductor device

The invention claimed is:

1. A semiconductor device, comprising:

a semiconductor member having a mesa structure in which a second semiconductor layer having one of a p-type conductivity type and an n-type conductivity type is laminated on a first semiconductor layer having the other one of the p-type conductivity type and the n-type conductivity type, so that the second semiconductor layer is exposed on an upper surface of the mesa structure, a pa junction interface is exposed on a side surface of the mesa structure, and the first semiconductor layer is exposed on an outside upper surface of the mesa structure;

an insulating film disposed on a side surface of the mesa structure and on an outside upper surface of the mesa structure;

a first electrode electrically connected to the second semiconductor layer on the upper surface of the mesa structure, and extends on the side surface of the mesa structure and on the outside upper surface of the mesa structure on the insulating film; and a second electrode electrically connected to the first semiconductor layer on a lower surface of the first semiconductor layer, the insulating film having a capacitance which is a value such that a first voltage applied to the insulating film between a first position which is a corner position where the side surface of the insulating film disposed on the side surface of the mesa structure and the upper surface of the insulating film disposed on the outside upper surface of the mesa structure are connected to each other, and a second position which is a corner position where the side surface of the mesa structure and the outside upper surface of the mesa structure are connected to each other, is equal to or smaller than a second voltage applied to the first semiconductor layer between a third position which is a position of a pry junction interface in a lower part of a region where the first electrode is in contact with the second semiconductor layer, and a fourth position which is a position directly under the third position at a height of the second position, the first voltage and the second voltage being respectively applied to the insulating film and the first semiconductor layer when a reverse bias voltage is applied between the first electrode and the second electrode, a thickness between a height of the third position and a height of the upper surface of the insulating film disposed on the outside upper surface, of the mesa structure being thinner than a thickness of the insulating film disposed on the outside upper surface of the mesa structure, a thickness of the first electrode disposed above the outside upper surface of the mesa structure being thinner than a thickness of the second semiconductor layer, and the thickness of the insulating film disposed on the outside upper surface of the mesa structure being thinner than a thickness between a height of the third position and the fourth position, the thickness of the first electrode disposed above the outside upper surface of the mesa structure being thinner than the thickness between the height of the third position and the fourth position, and the thickness of the first electrode disposed above the outside upper surface of the mesa structure being thinner than the thickness of the insulating film disposed on the outside upper surface of the mesa structure.

2. The semiconductor device according to claim 1, wherein the capacitance of the insulating film is a value such that the first voltage is equal to the second voltage.

3. The semiconductor device according to claim 1, wherein a relative dielectric constant of the insulating film is, equal to or larger than a relative dielectric constant of the semiconductor member.

4. The semiconductor device according to claim 1, wherein a relative dielectric constant of the insulating film is a value such that an electric field intensity applied to the second position when the reverse bias voltage is applied, is less than an electric field intensity applied to the fifth position which is a position of a pn junction interface of the side surface of the mesa structure when the insulating film is assumed to be made of silicon oxide.

* * * * *